(12) United States Patent
Shen et al.

(10) Patent No.: US 12,148,847 B2
(45) Date of Patent: Nov. 19, 2024

(54) SOLAR CELL AND PRODUCTION METHOD THEREOF, PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Mengchao Shen, Zhejiang (CN); Lipeng Wang, Zhejiang (CN); Zhongxiang Yang, Zhejiang (CN); Zhao Wang, Zhejiang (CN); Jie Yang, Zhejiang (CN); Xinyu Zhang, Zhejiang (CN)

(73) Assignees: ZHEJIANG JINKO SOLAR CO., LTD., Haining Zhejiang (CN); JINKO SOLAR CO., LTD., Jiangxi (CN)

( * ) Notice: Subject to any disclaimer, the term of this patent is extended or adjusted under 35 U.S.C. 154(b) by 9 days.

(21) Appl. No.: 17/848,369

(22) Filed: Jun. 23, 2022

(65) Prior Publication Data
US 2023/0387337 A1 Nov. 30, 2023

(30) Foreign Application Priority Data
May 26, 2022 (CN) .......................... 202210590274.5

(51) Int. Cl.
*H01L 31/0352* (2006.01)
*H01L 31/18* (2006.01)

(52) U.S. Cl.
CPC ...... *H01L 31/03529* (2013.01); *H01L 31/186* (2013.01)

(58) Field of Classification Search
CPC ....................................................... H02S 40/36
See application file for complete search history.

(56) References Cited

U.S. PATENT DOCUMENTS

| 4,322,571 A | 3/1982 | Stanbery |
| 9,214,353 B2 | 12/2015 | Yonehara et al. |

(Continued)

FOREIGN PATENT DOCUMENTS

| CN | 110299422 A | 10/2019 |
| CN | 111628047 A | 9/2020 |

(Continued)

OTHER PUBLICATIONS

Zhejiang Jinko Solar Co., Ltd., et al., Extended European Search Report, EP 22179892.9, Dec. 6, 2022, 42 pgs.

(Continued)

*Primary Examiner* — Daniel P Malley, Jr.
(74) *Attorney, Agent, or Firm* — USCH Law, PC

(57) ABSTRACT

Embodiments of the present disclosure relates to the field of solar cells, and in particular to a solar cell and a production method thereof, and a photovoltaic module. The solar cell includes: a N-type substrate; a P-type emitter formed on a first surface of the N-type substrate and including a first portion and a second portion, a top surface of the first portion includes a first pyramid structure, and at least a part of at least one inclined surface of the first pyramid structure is concave or convex relative to a center of the first pyramid structure, a top surface of the second portion includes a second pyramid structure, and inclined surfaces of the second pyramid structure are planar; and a tunnel layer and a doped conductive layer located on a second surface of the N-type substrate. The present disclosure can improve the photoelectric conversion performance of solar cells.

16 Claims, 7 Drawing Sheets

(56) References Cited

U.S. PATENT DOCUMENTS

| | | | |
|---|---|---|---|
| 2003/0134469 A1 | 7/2003 | Horzel et al. | |
| 2008/0000521 A1 | 1/2008 | Sivoththaman et al. | |
| 2009/0283145 A1 | 11/2009 | Kim et al. | |
| 2011/0139230 A1* | 6/2011 | Rohatgi | H01L 31/1804 257/E21.135 |
| 2013/0025656 A1* | 1/2013 | Yang | H01L 31/035272 136/255 |
| 2013/0171767 A1 | 7/2013 | Moslehi et al. | |
| 2013/0340822 A1* | 12/2013 | Nam | H01L 31/1804 136/256 |
| 2014/0065757 A1* | 3/2014 | Yi | H01L 31/0236 438/71 |
| 2014/0144487 A1* | 5/2014 | Kim | B32B 27/36 438/66 |
| 2014/0352779 A1* | 12/2014 | Smirnov | H01L 31/18 438/57 |
| 2015/0325716 A1 | 11/2015 | Baker-O'Neal et al. | |
| 2015/0372183 A1* | 12/2015 | Jin | H01L 31/1804 438/87 |
| 2016/0197209 A1* | 7/2016 | Jin | H01L 31/1804 438/98 |
| 2018/0047859 A1 | 2/2018 | Kim et al. | |
| 2018/0194619 A1* | 7/2018 | Greer | B05D 1/18 |

FOREIGN PATENT DOCUMENTS

| | | | |
|---|---|---|---|
| CN | 111640823 A | 9/2020 | |
| CN | 110600558 B | 6/2021 | |
| CN | 113594299 A | 11/2021 | |
| CN | 113675289 A | 11/2021 | |
| CN | 114038928 A | 2/2022 | |
| CN | 113675289 B | 3/2022 | |
| EP | 0851511 A1 * | 7/1998 | H01L 21/67109 |
| JP | 2005005352 A | 1/2005 | |
| JP | 2006024757 A | 1/2006 | |
| JP | 2013098543 A | 5/2013 | |
| JP | 2014007382 A | 1/2014 | |
| JP | 2016006907 A | 1/2016 | |
| JP | 2017022380 A | 1/2017 | |
| JP | 2018120979 A | 8/2018 | |
| JP | 6916972 B1 | 8/2021 | |
| JP | 7082235 B1 | 6/2022 | |
| JP | 2022128577 A | 9/2022 | |
| KR | 20160024153 A | 3/2016 | |
| TW | 201027782 A | 7/2010 | |
| WO | 2012121706 A1 | 9/2012 | |
| WO | 2012134061 A2 | 10/2012 | |

OTHER PUBLICATIONS

Zhejiang Jinko Solar Co., Ltd., et al., GB Official Search Report, GB 2218326.3, Jan. 17, 2023, 2 pgs.

Zhejiang Jinko Solar Co., Ltd et al., JP Decision to Grant a Patent with English translation, JP 2022-098517, Jul. 31, 2023, 5 pgs.

Zhejiang Jinko Solar Co., Ltd et al., AU Examination report No. 1 for your standard patent application, AU 2022204349, May 19, 2023, 8 pgs.

Zhejiang Jinko Solar Co., Ltd et al., AU Notice of acceptance for your patent application, AU 2022204349, Aug. 10, 2023, 4 pgs.

Lixia Yang, et al., "Optimization of silicon phramidal emitter by self-selective Ag-assisted chemical etching", RSC Advances, 24458-24462, DOI:10.1039/C4RA03120B, Apr. 2014, 5 pgs.

Zhejiang Jinko Solar Co., Ltd et al., AU First Office Action, AU 2023233208, Sep. 11, 2024, 6 pgs.

* cited by examiner

SOLAR CELL AND PRODUCTION METHOD THEREOF, PHOTOVOLTAIC MODULE

CROSS REFERENCE TO RELATED APPLICATIONS

The present application claims the benefit of priority under the Paris Convention to Chinese Patent Application No. 202210590274.5 filed on May 26, 2022, which is incorporated herein by reference in its entirety.

TECHNIC FIELD

Embodiments of the present disclosure relates to the field of solar cells, and in particular to a solar cell and a production method for the solar cell, and a photovoltaic module.

BACKGROUND

Solar cells have good photoelectric conversion capabilities. In solar cells, a diffusion process is required on the surface of silicon wafers to produce p-n junctions. In existing solar cells, boron diffusion processes are usually performed on the surface of silicon wafers to form an emitter on the surface of silicon wafers. On one hand, the emitter forms a p-n junction with the silicon wafer, and on the other hand, the emitter is also electrically connected with a metal electrode, so that the carriers transporting in the emitter can be collected by the metal electrode. Therefore, the emitter has a great influence on the photoelectric conversion performance of the solar cells.

The photoelectric conversion performance of the existing solar cells is poor.

SUMMARY

Embodiments of the present disclosure provide a solar cell and a production method thereof, and a photovoltaic module, which is at least conducive to the improvement of photoelectric conversion performance of a solar cell.

Some embodiments of the present disclosure provide a solar cell, including: a N-type substrate; a P-type emitter formed on a first surface of the N-type substrate, the P-type emitter includes a first portion and a second portion, a top surface of the first portion includes a first pyramid structure, and at least a part of at least one inclined surface of the first pyramid structure is concave or convex relative to a center of the first pyramid structure, a top surface of the second portion includes a second pyramid structure, and inclined surfaces of the second pyramid structure are planar, and in a direction perpendicular to the first surface of the N-type substrate, a junction depth of the first portion is greater than a junction depth of the second portion; and a tunnel layer and a doped conductive layer formed over a second surface of the N-type substrate in a direction away from the N-type substrate.

In an example, a crystal structure of the first portion of the P-type emitter has dislocations.

In an example, a sheet resistance of the first portion of the P-type emitter is lower than a sheet resistance of the second portion of the P-type emitter.

In an example, the sheet resistance of the first portion of the P-type emitter ranges from 20 ohm/sq to 300 ohm/sq, and the sheet resistance of the second portion of the P-type emitter ranges from 100 ohm/sq to 1000 ohm/sq.

In an example, a height of the first pyramid structure ranges from 0.1 μm to 5 μm, and an one-dimensional size of a bottom of the first pyramid structure ranges from 0.1 μm to 5 μm.

In an example, at least part of the first pyramid structure further includes a first substructure located at a top of the first pyramid structure, where the first substructure is a sphere or a spheroid.

In an example, a ratio of the junction depth of the first portion to the junction depth of the second portion is not less than 2.

In an example, the junction depth of the first portion ranges from 2 μm to 10 μm, and the junction depth of the second portion ranges from 0.1 μm to 3 μm.

In an example, a doping concentration at the top surface of the first portion of the P-type emitter is greater than or equal to a doping concentration at the top surface of the second portion of the P-type emitter.

In an example, the doping concentration at the top surface of the first portion of the P-type emitter ranges from $1E^{18}$ atoms/cm$^3$ to $5E^{20}$ atoms/cm$^3$.

In an example, a difference between the doping concentration at the top surface of the first portion and a doping concentration at a bottom surface of the first portion ranges from $1E^{16}$ atoms/cm$^3$ to $5E^{20}$ atoms/cm$^3$.

In an example, a difference between the doping concentration at the top surface of the second portion and a doping concentration at a bottom surface of the second portion ranges from $1E^{16}$ atoms/cm$^3$ to $1E^{20}$ atoms/cm$^3$.

In an example, a ratio of a width of the second portion to a width of the first portion is not less than 60.

In an example, the solar cell further includes a first metal electrode, where the first metal electrode is formed on the first surface of the N-type substrate, and is electrically connected to the first portion of the P-type emitter.

In an example, the P-type emitter further includes a transition region located between the first portion and the second portion, a doping concentration at a top surface of the transition region is greater than or equal to the doping concentration at the top surface of the second portion, and is less than or equal to the doping concentration at the top surface of the first portion.

Some embodiments of the present disclosure provide a production method for a solar cell, including: providing a N-type substrate; forming a P-type emitter on a first surface of the N-type substrate, where the P-type emitter includes a first portion and a second portion, a top surface of the first portion includes a first pyramid structure, and at least a part of at least one inclined surface of the first pyramid structure is concave or convex relative to a center of the first pyramid structure, a top surface of the second portion includes a second pyramid structure, and inclined surfaces of the second pyramid structure are planar, and in a direction perpendicular to the first surface of the N-type substrate, a junction depth of the first portion is greater than a junction depth of the second portion; and forming a tunnel layer and a doped conductive layer, where the tunnel layer and the doped conductive layer are sequentially formed over a second surface of the N-type substrate and stacked in a direction away from the N-type substrate.

In an example, forming the P-type emitter includes: providing a N-type initial substrate; depositing a trivalent doping source on a top surface of the N-type initial substrate; treating, by using a process of external energy source treatment, a preset region of the top surface of the N-type initial substrate, to diffuse the trivalent doping source treated by the process of external energy source treatment into an interior of the N-type initial substrate; performing a high temperature treatment on the N-type initial substrate to form the P-type emitter in the interior of the N-type initial substrate, a top surface of the P-type emitter is exposed from the N-type initial substrate; forming the N-type substrate in a region of the N-type initial substrate excluding the P-type emitter; and forming the first portion of the P-type emitter in the preset region of the N-type initial substrate, and forming the second portion of the P-type emitter in a region of the P-type emitter excluding the preset region.

In an example, depositing the trivalent doping source on the top surface of the N-type initial substrate includes forming a first thin film layer, where the first thin film layer includes the trivalent doping source, and further includes at least one of boron element, oxygen element, silicon element, chlorine element, nitrogen element or carbon element, a deposition time ranges from 20 s to 5000 s, and a temperature ranges from 500° C. to 1300° C.; and performing the high temperature treatment on the N-type initial substrate includes introducing, for a duration ranged from 500 s to 10000 s and under a temperature ranged from 500° C. to 1500° C., oxygen of a first flow rate to form a second thin film layer, a thickness of the second thin film layer is smaller than a thickness of the first thin film layer.

In an example, the first flow rate ranges from 200 sccm to 80000 sccm.

In an example, the process of external energy source treatment includes any one of laser doping process, plasma irradiation process or directional ion implantation process.

In an example, the production method further includes forming a first metal electrode, where the first metal electrode is electrically connected to the first portion of the P-type emitter.

In an example, a width of the first metal electrode is less than or equal to a width of the first portion of the P-type emitter.

Some embodiments of the present disclosure provide a photovoltaic module, including: a cell string formed by connecting a plurality of solar cells as described in any one of the above embodiments; an encapsulation layer used for covering a surface of the cell string; and a cover plate used for covering a surface of the encapsulation layer facing away from the cell string.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations.

DETAILED DESCRIPTION OF THE EMBODIMENTS

Figure 1:
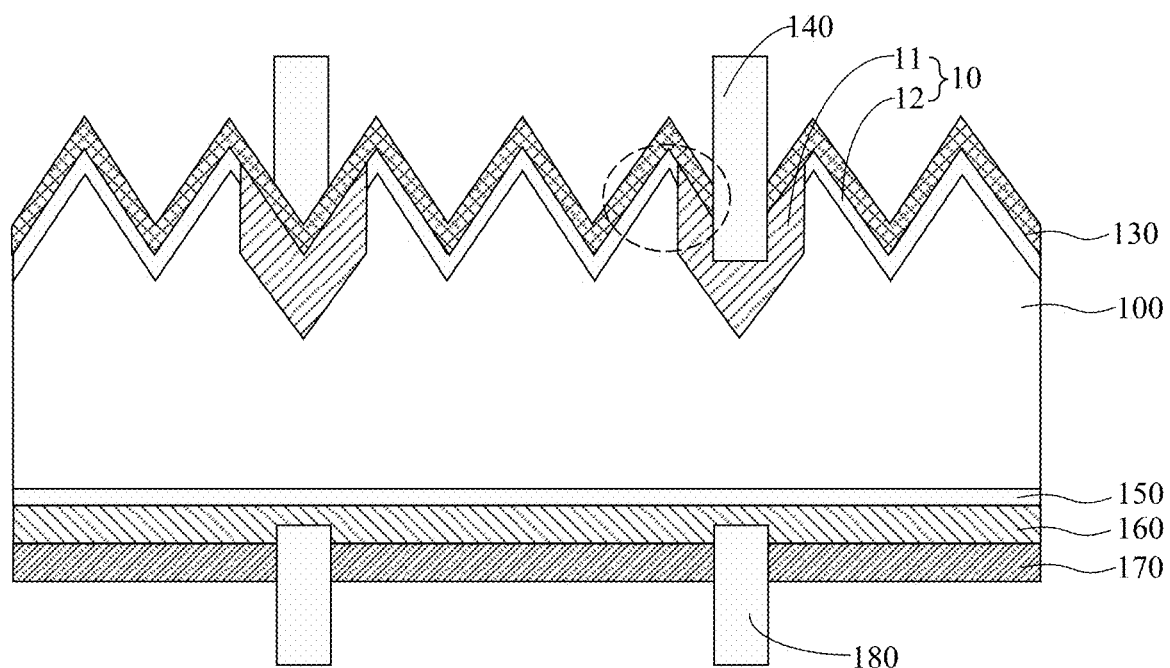
FIG. 1 is a structural schematic diagram of a solar cell according to an embodiment of the present disclosure.

It can be known from the background art that the existing solar cells have a poor photoelectric conversion performance.

By analysis, it is found that one of the reasons for the poor photoelectric conversion performance of the existing solar cells is that the emitter is usually electrically connected to a metal electrode, so that the metal electrode can collect carriers in the emitter. In order to reduce the contact resistance between the metal electrode and the emitter, the sheet resistance of the emitter should be reduced. At present, in order to reduce the sheet resistance of the emitter, the doping concentration of the emitter is usually increased. However, when the doping concentration of the emitter increases, the doping element in the emitter becomes too much, so that the doping element in the emitter becomes a strong recombination center, causing the increase of Auger recombination. Thus, the passivation performance of the emitter deteriorates, which in turn makes the photoelectric conversion performance of the solar cell to be poor.

Embodiments of the present disclosure provide a solar cell, provided with a P-type emitter located on a first surface of a N-type substrate, a top surface of a first portion of the P-type emitter includes a first pyramid structure, and at least a part of at least one inclined surface of the first pyramid structure is concave or convex relative to a center of the first pyramid structure. In other words, a crystal structure of the surface of the first portion of the P-type emitter is an irregular tetrahedral structure, which causes the first portion of the P-type emitter to have a deep energy level in interior, thereby reducing the sheet resistance of the first portion of the P-type emitter. Thus, the resistance of the first portion of the P-type emitter can be reduced without greatly increasing the doping concentration of the first portion of the P-type emitter. In this way, not only a good passivation performance of the first portion of the P-type emitter can be maintained, but also the ohmic contact can be improved, thereby improving the photoelectric conversion performance of the solar cell. Moreover, the second portion of the P-type emitter has a shallower junction depth, and inclined surfaces of the second pyramid structure of the top surface of the second portion are planar, that is, the second portion of the P-type emitter is a regular tetrahedral structure. Thus, no dislocation is formed in the second portion of the P-type emitter, thereby making the second portion of the P-type emitter maintain a high sheet resistance, and maintaining a good passivation performance of the second portion. In this way, the overall photoelectric conversion efficiency of the solar cell can be improved.

Embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be realized.

Figure 2:
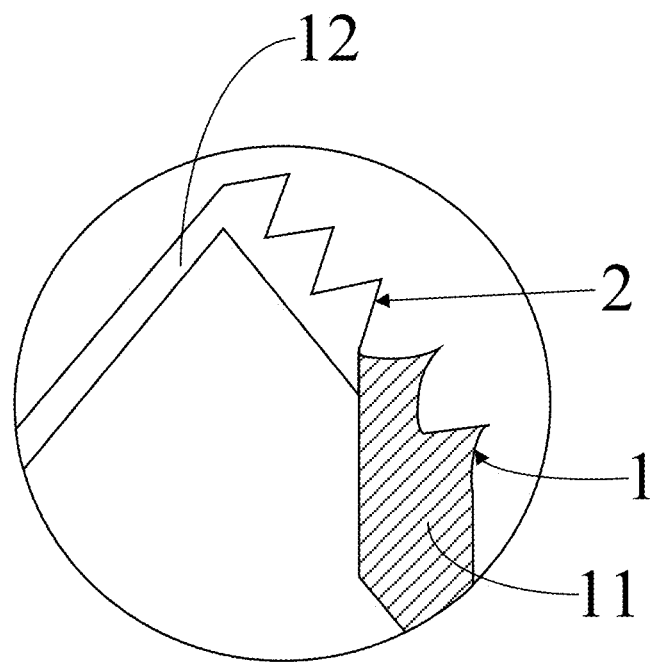
FIG. 2 is a partial enlarged view of the part marked with the dotted frame in FIG. 1.

FIG. 1 is a structural schematic diagram of a solar cell according to an embodiment of the present disclosure. FIG. 2 is a partial enlarged view of the part marked with the dotted frame in FIG. 1.

Referring to FIG. 1 and FIG. 2, the solar cell includes: a N-type substrate 100; a P-type emitter 10 formed on a first surface of the N-type substrate 100, the P-type emitter 10 includes a first portion 11 and a second portion 12, a top surface of the first portion 11 includes a first pyramid structure 1, and at least a part of at least one inclined surface of the first pyramid structure 1 is concave or convex relative to a center of the first pyramid structure 1, a top surface of the second portion 12 includes a second pyramid structure 2, and inclined surfaces of the second pyramid structure 2 are planar, and in a direction perpendicular to the first surface of the N-type substrate 100, a junction depth of the first portion 11 is greater than a junction depth of the second portion 12; and a tunnel layer 150 and a doped conductive layer 160 sequentially formed over a second surface of the N-type substrate 100 and at least partially stacked in a direction away from the N-type substrate 100.

The N-type substrate 100 is used to receive incident light and generate photo-generated carriers. In some embodiments, the N-type substrate 100 may be a N-type silicon substrate 100, and the material of the N-type silicon substrate may include at least one of monocrystalline silicon, polycrystalline silicon, amorphous silicon or microcrystalline silicon. The N-type substrate 100 is a N-type semiconductor substrate 100, that is, the N-type substrate 100 is doped with N-type dopant ions, and the N-type dopant ions may be any one of phosphorus ions, arsenic ions, or antimony ions.

In some embodiments, the solar cell is a tunnel oxide passivated contact (TOPCON) cell. The first surface and the second surface of the N-type substrate 100 are arranged opposite to each other, and both the first surface and the second surface of the N-type substrate 100 can be used to receive incident light or reflected light. In some embodiments, the first surface may be the back surface of the N-type substrate 100, and the second surface may be the front surface of the N-type substrate 100. In some other embodiments, the first surface may be the front surface of the N-type substrate 100, and the second surface may be the back surface of the N-type substrate 100.

In some embodiments, the second surface of the N-type substrate 100 may be designed as a pyramid textured surface, so that the reflectivity of the second surface of the N-type substrate 100 to incident light is low, therefore the absorption and utilization rate of light is high. The first surface of the N-type substrate 100 may be designed as a non-pyramid textured surface, such as a stacked step form, so that the tunnel oxide layer 110 located on the first surface of the N-type substrate 100 has high density and uniformity, therefore the tunnel oxide layer 110 has a good passivation effect on the first surface of the N-type substrate 100. In some embodiments, the first surface may be the back surface of the N-type substrate 100, and the second surface may be the front surface of the N-type substrate 100. In some other embodiments, the first surface may be the front surface of the N-type substrate 100, and the second surface may be the back surface of the N-type substrate 100.

Figure 3:
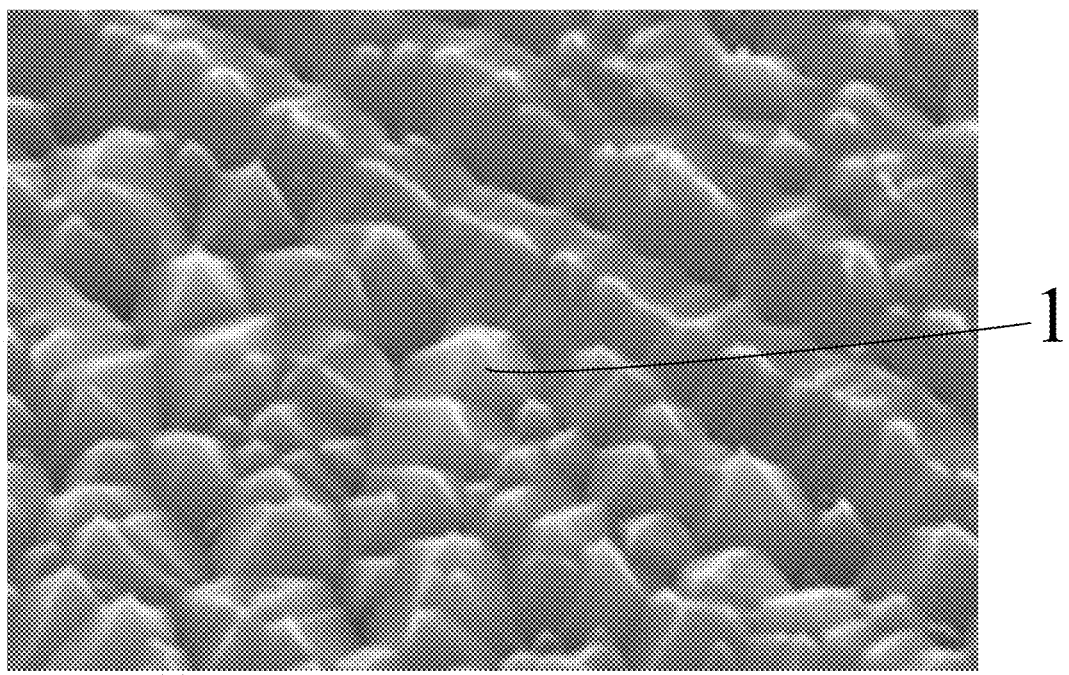
FIG. 3 is a view of a first pyramid structure using an electron microscope in a solar cell according to an embodiment of the present disclosure.

Referring to FIG. 3, the first pyramid structure 1 includes a bottom surface and three inclined surfaces connected to the bottom surface, and the three inclined surfaces connect to each other to form a tetrahedral structure. At least a part of at least one inclined surface of the first pyramid structure 1 is concave or convex relative to the center of the first pyramid structure 1, that is, at least one inclined surface of the first pyramid structure 1 has irregular deformation. For example, one of the inclined surfaces of the pyramid structure 1 may be only concave relative to the center of the first pyramid structure 1, or only convex relative to the center of the first pyramid structure 1, or a part of the inclined surface is concave relative to the center of the first pyramid structure 1 and another part is convex relative to the center of the first pyramid structure 1. In some embodiments, in the first pyramid structure 1, only one inclined surface has irregular deformation; in some other embodiments, there may be two inclined surfaces having irregular deformation; in still some other embodiments, all of the three inclined surfaces have irregular deformation. In addition, in yet some other embodiments, at least a part of the bottom surface of the first pyramid structure 1 is concave or convex relative to the center of the first pyramid structure 1, that is, the bottom surface of the first pyramid structure 1 also has irregular deformation.

It should be understood that the first pyramid structure 1 and the second pyramid structure 2 here are different from the textured structure, and the first pyramid structure 1 and the second pyramid structure 2 in the embodiments of the present application refer to the crystal structure morphologies of the P-type emitter 10. By changing the morphology of the crystal structure of the P-type emitter 10, the performance of the first portion 11 of the P-type emitter 10 is changed.

As an example, at least one inclined surface in the first pyramid structure 1 is designed to have irregular deformation, so that the crystal structure of the first pyramid structure 1 becomes from a regular tetrahedral structure to an irregular tetrahedral structure, thereby making the first portion 11 of the P-type emitter 10 have a deep energy level in interior, and reducing the sheet resistance of the first portion 11 of the P-type emitter 10. In this way, the resistance of the first portion 11 of the P-type emitter 10 can be reduced without greatly increasing the doping concentration of the first portion 11 of the P-type emitter 10. It should be understood that the regular tetrahedral structure here refers to that the inclined surfaces and the bottom surface of the tetrahedral structure have no irregularly deformation, for example, the inclined surfaces and the bottom surface of the tetrahedral structure may be planes.

Continuing to refer to FIG. 1 and FIG. 2, in some embodiments, the crystal structure of the first portion 11 of the P-type emitter 10 has dislocations. In some embodiments, the dislocations are formed by a series of dangling bonds, and thus, when there are dislocations in the crystal structure of the first portion 11 of the P-type emitter 10, dangling bonds are correspondingly generated. Dislocations and dangling bonds can form deep energy levels in interior of the first portion 11 of the P-type emitter 10, and the formed deep energy levels reduce the sheet resistance of the first portion 11 of the P-type emitter 10. That is to say, the sheet resistance of the first portion 11 of the P-type emitter 10 can be reduced without greatly increasing the doping concentration of the first portion 11 of the P-type emitter 10, so that both a low sheet resistance of the first portion 11 of the P-type emitter 10 and a reduced doping concentration of the first portion 11 of the P-type emitter 10 can be obtained. In this way, not only the passivation performance of the first portion 11 of the P-type emitter 10 can be good, but also the ohmic contact of P-type emitter 10 can be improved.

It should be understood that the larger the height and the one-dimensional size of the bottom of the first pyramid structure 1 in the first portion 11 of the P-type emitter 10 are, the larger the overall size of the first pyramid structure 1 is, so that in a unit area, the number of the first pyramid structures 1 in the first portion 11 of the P-type emitter 10 is smaller. Since the dislocations in the first portion 11 of the P-type emitter 10 are formed by the first pyramid structures 1, the smaller the number of the first pyramid structures 1 in the first portion 11 of the P-type emitter 10 in a unit area, the less dislocations are formed, that is, the lower the dislocation density is. Correspondingly, the smaller the size of the first pyramid structure 1 is, the greater the number of the first pyramid structures 1 in the first portion 11 of the P-type emitter 10 per unit area, and the greater the dislocation density. Based on this, in some embodiments, the height of the first pyramid structure 1 is set to be 0.1 μm-5 μm, and the one-dimensional size of the bottom of the first pyramid structure 1 is set to be 0.1 μm-5 μm. Within this range, on one hand, the dislocation density in the first portion 11 of the P-type emitter 10 can be made higher, so that the deep energy level formed based on dislocations can be higher, thereby leading to a lower sheet resistance of the first portion 11 of the P-type emitter 10, and improving ohmic contact. On the other hand, within this range, excessive dislocation density in the first part 11 of the P-type emitter 10 can be avoided, which can prevent the problem of occurring an excessive deep energy level in the first portion 11 of the P-type emitter 10 due to excessive dislocation density, thereby forming a strong recombination center in the P-type emitter 10. In this way, the passivation performance of the first portion 11 of the P-type emitter 10 can be improved.

Figure 4:
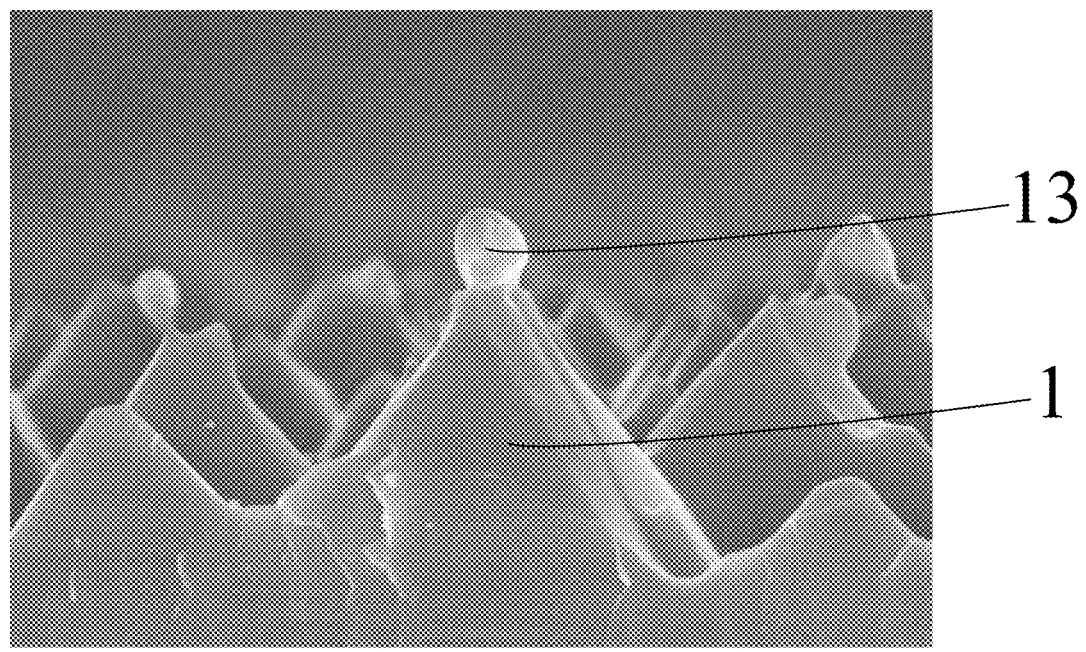
FIG. 4 is a view of another first pyramid structure using an electron microscope in a solar cell according to an embodiment of the present disclosure.

Referring to FIG. 4, in some embodiments, at least part of the first pyramid structure 1 further includes a first substructure 13 located at a top of the first pyramid structure 1, and the first substructure 13 is a sphere or a spheroid. The first substructure 13 is also one of the irregular deformations of the first pyramid structure 1. The existence of the first substructure 13 makes the deformation degree of the first pyramid structure 1 greater, correspondingly, larger dislocations can be generated, so that the formed deep energy level is higher, and the sheet resistance of the first portion 11 of the P-type emitter 10 can be further reduced.

Figure 5:
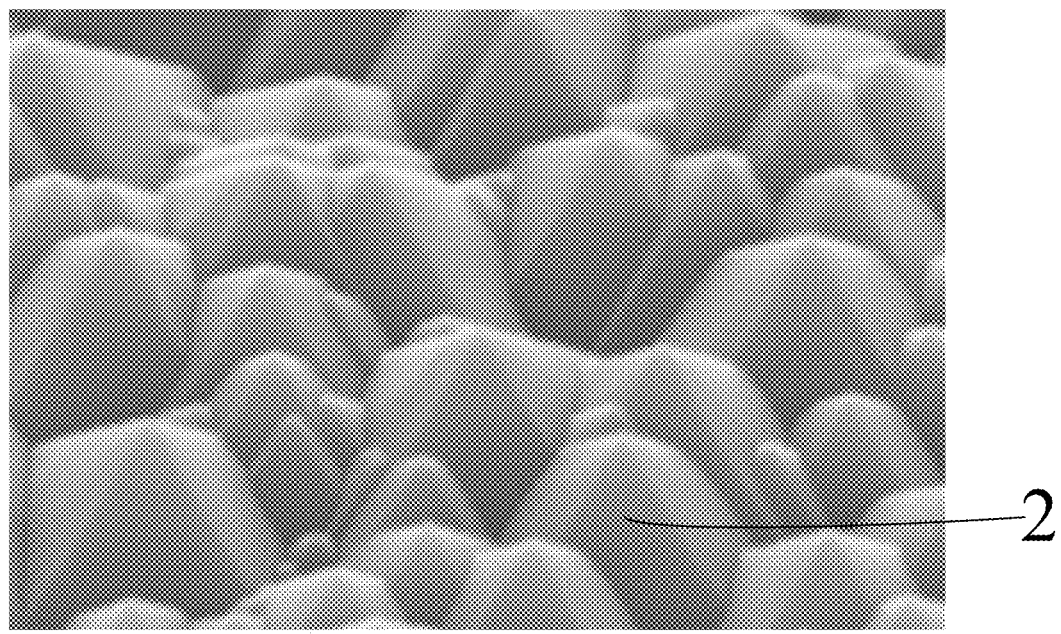
FIG. 5 is a view of a second pyramid structure using an electron microscope in a solar cell according to an embodiment of the present disclosure.

Referring FIGS. 1, 2 and 5, the inclined surfaces of the second pyramid structure 2 on the top surface of the second portion 12 are designed to be planes, that is, the second pyramid structure 2 is not irregularly deformed, so that the second pyramid structure 2 is a regular tetrahedron structure. Thus, dislocations and dangling bonds will not be caused in the second portion 12 of the P-type emitter 10, and thus no deep energy levels will be formed in the second portion 12 of the P-type emitter 10, thereby leading to a relatively high sheet resistance of the second portion 12 of the P-type emitter 10, and maintaining a good passivation performance of the second portion 12 of the P-type emitter 10. In this way, the open-circuit voltage and short-circuit current of the solar cell can be relatively high, and photoelectric conversion performance of the solar cell can be improved. In some other embodiments, it may be designed that the top surface of the second portion 12 of the P-type emitter 10 includes the second pyramid structure 2, and at least a part of at least one inclined surface of the second pyramid structure 2 is concave or convex relative to a center of the second pyramid structure 2. That is to say, the top surface of the entire P-type emitter 10 has an irregular tetrahedral structure, so that the entire P-type emitter 10 has dislocations and dangling bonds, thereby reducing the sheet resistance of the entire P-type emitter 10.

In some embodiments, the sheet resistance of the first portion 11 of the P-type emitter 10 is lower than the sheet resistance of the second portion 12 of the P-type emitter 10. That is to say, the sheet resistance of the first portion 11 of the P-type emitter 10 is relatively low, so that a transport rate of carriers in the first portion 11 of the P-type emitter 10 can be increased, which is conducive to the transport of carriers from the first portion 11 of the P-type emitter 10 to the metal electrode when an electrical connection is formed between the first portion 11 of the P-type emitter 10 and the metal electrode, thereby improving a collection rate of carriers by the metal electrode, and improving the photovoltaic performance of the solar cell. By setting the sheet resistance of the second portion 12 of the P-type emitter 10 to be low, a good passivation performance of the second portion 12 of the P-type emitter 10 can be maintained, the recombination of carriers can be suppressed, and the number of carriers can be increased, thereby increasing the open-circuit voltage and short-circuit current of the solar cell. By setting the sheet resistance of the first portion 11 to be lower than that of the second portion 12, the ohmic contact can be improved while maintaining a good passivation effect of the P-type emitter 10, thereby improving the overall photoelectric conversion performance of the solar cell.

As an example, in some embodiments, the sheet resistance of the first portion 11 of the P-type emitter 10 may be 20 ohm/sq~300 ohm/sq, for example may be 20 ohm/sq~50 ohm/sq, 50 ohm/sq~100 ohm/sq, 100 ohm/sq~150 ohm/sq, 150 ohm/sq~200 ohm/sq, 200 ohm/sq~250 ohm/sq or 250 ohm/sq~300 ohm/sq, the sheet resistance of the second portion 12 of the P-type emitter 10 may be 100 ohm/sq~1000 ohm/sq, for example may be 100 ohm/sq~200 ohm/sq, 200 ohm/sq~300 ohm/sq, 300 ohm/sq~500 ohm/sq, 500 ohm/sq~700 ohm/sq, 700 ohm/sq~800 ohm/sq or 800 ohm/sq18 1000 ohm/sq. The sheet resistance of the first portion 11 of the P-type emitter 10 is designed to be in the range of 20 ohm/sq~300 ohm/sq, so that the sheet resistance of the first portion 11 is much lower than that of the second portion 12, thus an improved ohmic contact of the first portion 11 of the P-type emitter 10 can be obtained, which can reduce the contact resistance between the first portion 11 of the P-type emitter 10 and the metal electrode when the metal electrode is arranged to be in an electrical contact with the first portion 11 of the P-type emitter 10, thereby improving the transport efficiency of carriers in the first portion 11 of the P-type emitter 10 and the second portion 12 of the P-type emitter 10. On the other hand, within this range, the sheet resistance of the first portion 11 of the P-type emitter 10 is not too low, so that the first portion 11 of the P-type emitter 10 can be prevented from becoming a strong recombination center. In addition, by setting the resistance of the second portion 12 of the P-type emitter 10 to 100 ohm/sq-1000 ohm/sq, the recombination of carriers in the second portion 12 of the P-type emitter 10 can be suppressed, thereby improving the passivation effect of the emitter. In this way, the open-circuit voltage, the short-circuit current and the photoelectric conversion efficiency of the solar cell can be improved.

The junction depth of the first portion 11 is greater than that of the second portion 12, that is, the junction depth of the first portion 11 of the P-type emitter 10 is deeper, and the junction depth of the second portion 12 of the P-type emitter 10 is shallower. That is to say, the thickness of the first portion 11 is relatively large, on one hand, more doping elements, such as boron, can exist in the first portion 11 of the P-type emitter 10, so that the doping concentration of the first portion 11 the P-type emitter 10 is higher, thereby further reducing the sheet resistance of the first portion 11 of the P-type emitter 10, which is conducive to the improvement of the ohmic contact. On the other hand, since the junction depth of the first portion 11 of the P-type emitter 10 is deep, an electrical connection can be provided between the metal electrode and the first portion 11 of the P-type emitter 10, so that the problem that the paste for forming the metal electrode penetrates the P-type emitter 10 and directly contacts with the N-type initial substrate during the sintering of the paste can be prevented. In addition, the junction depth of the second portion 12 is designed to be shallower, that is, the thickness of the second portion 12 of the P-type emitter 10 is smaller, so that the number of doping elements of the second portion 12 is smaller than that of the first portion 11, that is, the doping concentration of the second portion 12 of the P-type emitter 10 is lower. Therefore, compared with the first portion 11 of the P-type emitter 10, the second portion 12 of the P-type emitter 10 has a better passivation effect, which is conducive to reduction of the recombination of carriers and improvement of the open-circuit voltage and short-circuit current of the solar cell.

In some embodiments, a ratio of the junction depth of the first portion 11 to the junction depth of the second portion 12 is not less than 2. Preferably, the ratio of the junction depth of the first portion 11 to the junction depth of the second portion 12 ranges from 2 to 5. For example, the ratio can be 2, 2.5, 3, 3.5, 4, 4.5 or 5. The junction depth of the first portion 11 is much deeper than that of the second portion 12, so that the junction depth of the first portion 11 of the P-type emitter 10 is deeper. In this way, when the metal electrode is electrically connected with the first portion 11 of the P-type emitter 10, it can be ensured that the paste will not burn through the first portion 11 of the p-type emitter 10 during the sintering, so as to prevent the problem of damaging the p-n junction due to the contact between the metal electrode and the substrate 100, thereby ensuring better photoelectric conversion performance of the solar cell.

Considering that it is necessary to keep the junction depth of the first portion 11 not too deep, so as to avoid too many doping elements in the first portion 11 of the P-type emitter 10 to form a strong recombination center, in some embodiments, the junction depth of the first portion 11 is set to be 2 μm~10 μm, for example, the junction depth can be 2 μm~3 μm, 3 μm~4 μm, 4 μm~5 μm, 5 μm~6 μm, 6 μm~7 μm, 7 μm~8 μm, 8 μm~9 μm or 9 μm~10 μm. The junction depth of the second portion 12 is set to be 0.1 μm~3 μm, for example, the junction depth can be 0.1 μm~0.5 μm, 0.5 μm~1 μm, 1 μm~1.5 μm, 1.5 μm~2 μm, 2 μm~2.5 μm or 2.5 μm~3 μm. Within this range, there are fewer doping elements in the second portion 12 of the P-type emitter 10, so that a better passivation effect can be obtained.

In some embodiments, the doping concentration at the top surface of the first portion 11 of the P-type emitter 10 is greater than or equal to the doping concentration at the top surface of the second portion 12 of the P-type emitter 10. As an example, in some embodiments, the doping concentration at the top surface of the first portion 11 of the P-type emitter 10 is greater than the doping concentration at the top surface of the second portion 12 of the P-type emitter 10. The doping concentration at the top surface of the first portion 11 of the P-type emitter 10 is relatively high, which is conducive to further reduction of the sheet resistance of the first portion 11. The doping concentration at the top surface at the second portion 12 of the P-type emitter 10 is relatively low, so that the sheet resistance of the second portion 12 is relatively high, which is conducive to maintenance of a good passivation effect of the second portion 12 of the P-type emitter 10.

In some other embodiments, the doping concentration at the top surface of the first portion 11 of the P-type emitter 10 is equal to the doping concentration at the top surface of the second portion 12 of the P-type emitter 10, that is, the doping concentration at the top surface of the first portion 11 of the P-type emitter 10 is relatively low. The crystal structure of the surface of the first portion 11 of the P-type emitter 10 is an irregular tetrahedral structure, which will cause dislocations in the first portion 11 of the P-type emitter 10, so that the first portion 11 of the P-type emitter 10 has deep energy levels in interior. In this way, the sheet resistance of the first portion 11 of the P-type emitter 10 can be reduced, thereby improving the ohmic contact. At the same time, since the doping concentration at the top surface of the first portion 11 of the P-type emitter 10 is relatively low, the passivation effect of the first portion 11 of the P-type emitter 10 can be kept good. As an example, in some embodiments, the doping element in the P-type emitter 10 may be a P-type trivalent doping source, such as boron.

As an example, in some embodiments, the doping concentration at the top surface of the first portion 11 of the P-type emitter 10 may be $1E^{18}$-$5E^{20}$ atoms/cm$^3$, for example, may be $1E^{15}$-$1E^{16}$ atoms/cm$^3$, $1E^{16}$-$1E^{17}$ atoms/cm$^3$, $1E^{17}$-$1E^{18}$ atoms/cm$^3$, $1E^{18}$-$1E^{19}$ atoms/cm$^3$ or $1E^{19}$-$5E^{20}$ atoms/cm$^3$. Within this range, on one hand, the doping concentration of the formed first portion 11 of the P-type emitter 10 is relatively high, so that the first portion 11 of the P-type emitter 10 has a relatively low sheet resistance, which can increase the transport efficiency of carriers. On the other hand, within this range, the doping concentration at the top surface of the first portion 11 of the P-type emitter 10 will not be too high, that is, the content of the doping element in the first portion 11 of the P-type emitter 10 It will not be too much, so that the problem that many doping elements become strong recombination centers due to excessive doping elements in the first portion 11 of the P-type emitter 10, leading to poor passivation capability of the first portion 11 of the P-type emitter 10 can be avoided.

In some embodiments, concentration of the top surface of the second portion 12 of the P-type emitter 10 may be $1E^{18}$-$1E^{20}$ atoms/cm$^3$, for example, may be $1E^{15}$-$1E^{16}$ atoms/cm$^3$, $1E^{16}$-$1E^{17}$ atoms/cm$^3$, $1E^{17}$-$1E^{18}$ atoms/cm$^3$, $1E^{18}$-$1E^{19}$ atoms/cm$^3$ or $1E^{19}$-$1E^{20}$ atoms/cm$^3$. The doping concentration at the top surface of the second portion 12 of the P-type emitter 10 can be set to be $1E^{14}$-$9E^{19}$ atoms/cm$^3$, so that the doping elements in the second portion 12 of the P-type emitter 10 are relatively few. In this way, a good passivation performance of the second portion 12 of the P-type emitter 10 can be maintained, and the open-circuit voltage and short-circuit current of the formed solar cell can be effectively improved.

In some embodiments, in a direction from the top surface of the P-type emitter 10 to the bottom surface of the P-type emitter 10, the doping concentration in the interior of the first portion 11 of the P-type emitter 10 gradually decreases, and the doping concentration in the interior of the second portion 12 of the P-type emitter 10 gradually decreases. That is to say, each of the first portion 11 of the P-type emitter 10 and the second portion 12 of the P-type emitter 10 has a descending doping concentration gradient, which is conducive to the transport of carriers in the first portion 11 of the P-type emitter 10 and the second portion 12 of the P-type emitter 10 from the area with a relatively high concentration to the area with a relatively low concentration, until to the substrate 100. In this way, the transport speed of carriers can be increased and the open-circuit voltage of the solar cell can be improved.

As an example, in some embodiments, the difference between the doping concentration at the top surface of the first portion 11 and the doping concentration at the bottom surface of the first portion 11 is $1E^{16}$ atoms/cm$^3$ to $5E^{20}$ atoms/cm$^3$. Within this range, on one hand, the difference in doping concentration in the interior of the first portion 11 of the P-type emitter 10 is relatively high, thereby facilitating the transport of carriers. On the other hand, within this range, the overall doping concentration in the interior of the first portion 11 of the P-type emitter 10 is relatively high, so that the sheet resistance can be kept low.

In some embodiments, the difference between the doping concentration at the top surface of the second portion 12 and the doping concentration at the bottom surface of the second portion 12 is $1E^{16}$ atoms/cm$^3$-$1E^{20}$ atoms/cm$^3$. Within this range, the doping concentration in the interior of the second portion 12 of the P-type emitter 10 will not be too low, so that the normal transport of carriers in the second portion 12 of the P-type emitter 10 can be ensured. In addition, within this range, the overall doping concentration of the second portion 12 of the P-type emitter 10 can be kept low, thus Auger recombination can be prevented from occurring in the second portion 12 of the P-type emitter 10.

In some embodiments, the ratio of the width of the second portion 12 to the width of the first portion 11 is not less than 60. As an example, the ratio of the width of the second portion 12 to the width of the first portion 11 may be 60 to 200, for example, the ratio may be 60, 80, 100, 120, 140, 160, 180 or 200. The width of the second portion 12 is designed to be much larger than the width of the first portion 11, that is to say, the second portion 12 of the P-type emitter 10 with relatively low sheet resistance accounts for a higher proportion, since the second portion 12 of the P-type emitter 10 has better passivation performance and can suppress the recombination of carriers, the overall passivation performance of the P-type emitter 10 is good. Furthermore, since the first portion 11 of the P-type emitter 10 only needs to be electrically connected to the metal electrode to improve the ohmic contact with the metal electrode, the width of the first portion 11 of the P-type emitter 10 can be set to be small, so as to improve the ohmic contact and maintain relatively good passivation performance of the emitter.

Referring to FIG. 1, in some embodiments, the solar cell further includes: a first metal electrode 140, the first metal electrode is formed on the first surface of the N-type substrate 100 and is electrically connected to the first portion 11 of the P-type emitter 10. Since the carriers in the P-type emitter 10 will transport to the first metal electrode 140 electrically connected to the first portion 11 of the P-type emitter 10, and the sheet resistance of the first portion 11 of the P-type emitter 10 is low, so that the contact resistance between the first portion 11 of the P-type emitter 10 and the first metal electrode 140 is low, thereby increasing the transport rate of carriers to the first metal electrode 140. In addition, since the first portion 11 of the P-type emitter 10 has a relatively deep junction depth, it is difficult for the formed first metal electrode 140 to penetrate the first portion 11 of the P-type emitter 10 during the preparation of the first metal electrode 140. In this way, the structure of the formed p-n junction will not be damaged, which is conducive to maintenance of the integrity of the solar cell, thereby maintaining the good photoelectric conversion performance of the solar cell.

Figure 6:
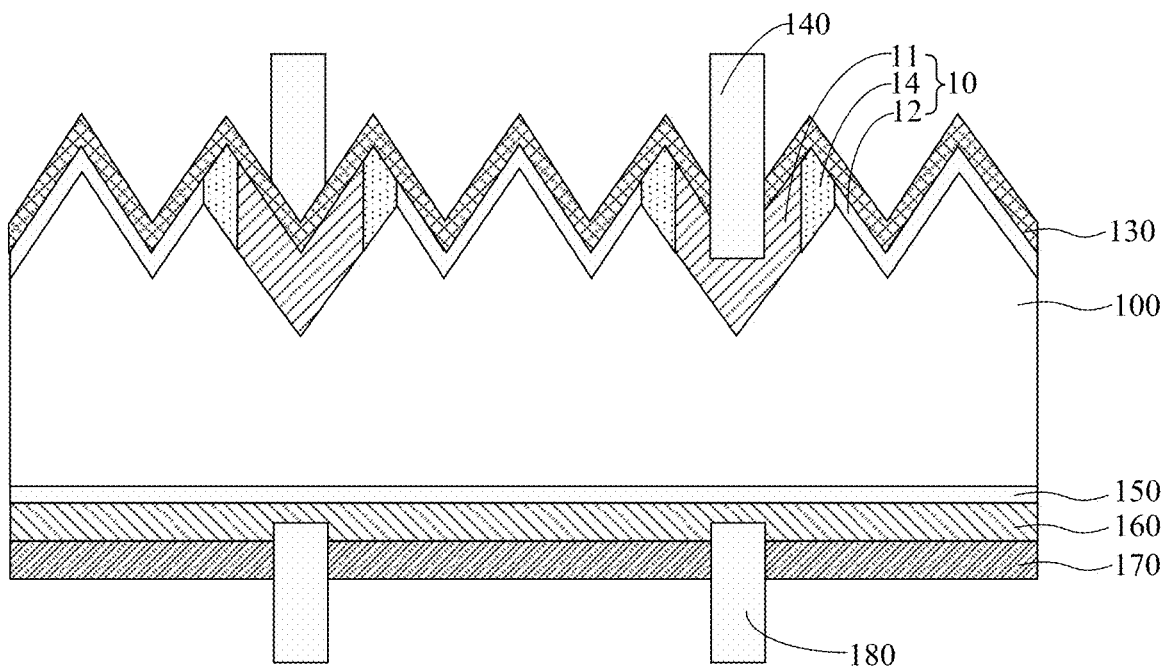
FIG. 6 is a structural schematic diagram of another solar cell according to an embodiment of the present disclosure.

Referring to FIG. 6, in some embodiments, the P-type emitter 10 further includes a transition region 14 located between the first portion 11 and the second portion 12, a doping concentration at a top surface of the transition region 14 is greater than or equal to the doping concentration at the top surface of the second portion 12, and is less than or equal to the doping concentration at the top surface of the first portion 11. As an example, in some embodiments, when the doping concentration at the top surface of the first portion 11 is greater than the doping concentration at the top surface of the second portion 12, the doping concentration at the top surface of the transition region 14 is set to be greater than the doping concentration at the top surface of the second portion 12, and is lower than the doping concentration at the top surface of the first portion 11, that is, the doping concentration of the transition region 14 gradually decreases in a direction from the first portion 11 to the second portion 12. In this way, more gradation space can be provided for the concentration of the doping element in the P-type emitter 10, so that a sudden change of potential energy difference between the first portion 11 and the second portion 12 can be avoided, so as to reduce the probability of recombination of the carrier in the transition region 14. Furthermore, the provision of the transition region 14 further leads to a gradient trend of the sheet resistance in the transition region 14, thereby reducing the transport resistance of the transition region 14 to carriers, which is conducive to the transport of the carriers in the second portion 12 of the P-type emitter 10 to the first portion 11 of the P-type emitter 10, and further to the first metal electrode 140. In this way, the transport efficiency of the carriers can be improved, thereby improving the photoelectric conversion efficiency of the solar cell.

It should be understood that in some other embodiments, the doping concentration at the top surface of the transition region 14 may be equal to the doping concentration at the top surface of the first portion 11, or be equal to the doping concentration at the top surface of the second portion 12. In still some other embodiments, the doping concentration at the top surface of the transition region 14 may be equal to the doping concentration at the top surface of the first portion 11 and the doping concentration at the top surface of the second portion 12.

Referring to FIG. 1, in some embodiments, the solar cell further includes an anti-reflection layer 130 located on the top surface of the first portion 11 of the P-type emitter 10 and the top surface of the second portion 12 of the P-type emitter 10, the anti-reflection layer is used for reducing reflection of incident light by the substrate. In some embodiments, the anti-reflection layer may be a silicon nitride layer including a silicon nitride material.

The tunnel layer 150 is used to achieve interface passivation of the second surface of the substrate. As an example, in some embodiments, the material of the tunnel layer 150 may be a dielectric material, such as silicon oxide.

The doped conductive layer 160 is used to form field passivation. In some embodiments, the material of the doped conductive layer 160 may be doped silicon. As an example, in some embodiments, the doped conductive layer 160 and the substrate include doping elements of the same conductivity type. The doped silicon may include one or more of N-type doped polysilicon, N-type doped microcrystalline silicon and N-type doped amorphous silicon.

In some embodiments, the solar cell further includes a first passivation layer 170 located on the surface of the doped conductive layer 160 away from the substrate. In some embodiments, the material of the first passivation layer 170 may be one or more of silicon oxide, aluminum oxide, silicon nitride, silicon oxynitride and silicon oxycarbonitride. As an example, in some embodiments, the first passivation layer 170 may be a single-layer structure. In some other embodiments, the first passivation layer 170 may be a multi-layer structure.

In some embodiments, the solar cell further includes a second metal electrode 180 penetrating the first passivation layer 170 to form an electrical connection with the doped conductive layer 160.

In the solar cell as described in the above embodiments, at least one inclined surface in the first pyramid structure 1 is designed to have irregular deformation, so that the crystal structure of the first pyramid structure 1 becomes from a regular tetrahedral structure to an irregular tetrahedral structure, thereby making the first portion 11 of the P-type emitter 10 have a deep energy level in interior, and reducing the sheet resistance of the first portion 11 of the P-type emitter 10. In this way, the resistance of the first portion 11 of the P-type emitter 10 can be reduced without greatly increasing the doping concentration of the first portion 11 of the P-type emitter 10. Furthermore, the inclined surfaces of the second pyramid structure 2 on the top surface of the second portion 12 are designed to be planes, that is, the second pyramid structure 2 is not irregularly deformed, so that the second pyramid structure 2 is a regular tetrahedron structure. Thus, dislocations and dangling bonds will not be caused in the second portion 12 of the P-type emitter 10, and thus no deep energy levels will be formed in the second portion 12 of the P-type emitter 10, thereby leading to a relatively high sheet resistance of the second portion 12 of the P-type emitter 10, and maintaining a good passivation performance of the second portion 12 of the P-type emitter 10. In this way, the open-circuit voltage and short-circuit current of the solar cell can be relatively high, and photoelectric conversion performance of the solar cell can be improved.

Figure 7:
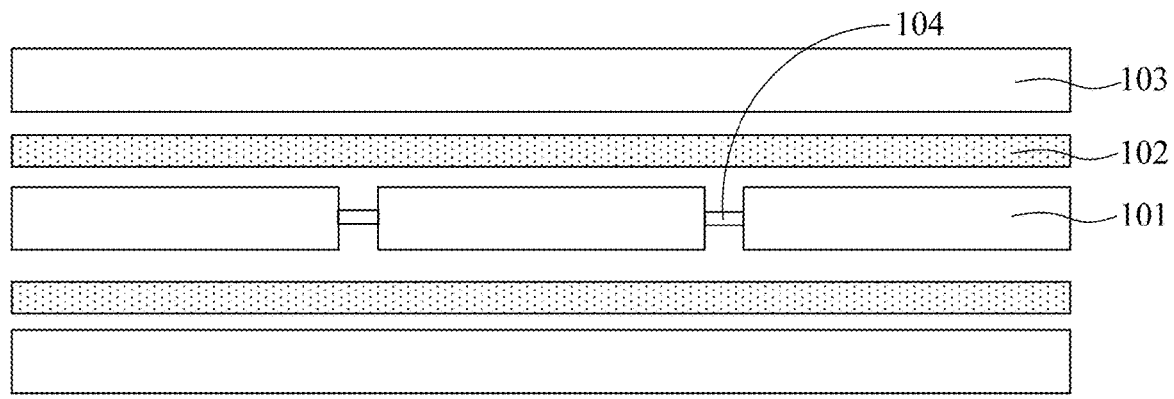
FIG. 7 is a structural schematic diagram of a photovoltaic module according to an embodiment of the present disclosure.

Embodiments of the present disclosure further provide a photovoltaic module, referring to FIG. 7, the photovoltaic module includes: a cell string formed by connecting a plurality of solar cells 101 as provided in the above embodiments; an encapsulation layer 102 used for covering a surface of the cell string; and a cover plate 103 used for covering a surface of the encapsulation layer 102 facing away from the cell string. The solar cells 101 are electrically connected in a form of a single piece or multiple pieces to form a plurality of cell strings, and the plurality of cell strings are electrically connected in series and/or parallel.

As an example, in some embodiments, the plurality of cell strings may be electrically connected by conductive strips 104. The encapsulation layer 102 covers the front and back surfaces of the solar cell 101. As an example, the encapsulation layer 102 may be an organic encapsulation adhesive film, such as an adhesive film of ethylene-vinyl acetate copolymer (EVA), an adhesive film of polyethylene octene co-elastomer (POE) or an adhesive film of polyethylene terephthalate (PET) and the like. In some embodiments, the cover plate 103 may be a cover plate 103 with a light-transmitting function, such as a glass cover plate, a plastic cover plate, or the like. As an example, the surface of the cover plate 103 facing the encapsulation layer 102 may be a concave-convex surface, thereby increasing the utilization rate of incident light.

Another embodiment of the present disclosure further provides a production method for a solar cell, the solar cell as provided in the above embodiments can be obtained by implementing the method. The production method for a semiconductor structure provided by this embodiment of the present disclosure will be described in detail below with reference to the accompanying drawings.

FIGS. 8 to 14 are structural schematic diagrams corresponding to the operations of the production method for the solar cell provided by this embodiment of the present disclosure.

A N-type substrate is provided.

The N-type substrate is used to receive incident light and generate photo-generated carriers. In some embodiments, the N-type substrate may be a N-type silicon substrate 100, and the material of the N-type silicon substrate may include at least one of monocrystalline silicon, polycrystalline silicon, amorphous silicon or microcrystalline silicon. The N-type substrate is a N-type semiconductor substrate, that is, the N-type substrate is doped with N-type dopant ions, and the N-type dopant ions may be any one of phosphorus ions, arsenic ions, or antimony ions.

Referring to FIGS. 8 to 12, a P-type emitter 10 is formed on a first surface of the N-type substrate, the P-type emitter 10 includes a first portion 11 and a second portion 12, a top surface of the first portion 11 includes a first pyramid structure 1 (referring to FIG. 2), and at least a part of at least one inclined surface of the first pyramid structure 1 is concave or convex relative to a center of the first pyramid structure 1, a top surface of the second portion 12 includes a second pyramid structure 2 (referring to FIG. 2), and inclined surfaces of the second pyramid structure are planar, and in a direction perpendicular to the first surface of the N-type substrate 100, a junction depth of the first portion 11 is greater than a junction depth of the second portion 12.

In the formed first pyramid structure 1, at least a part of at least one inclined surface is concave or convex relative to the center of the first pyramid structure 1, that is, at least one inclined surface of the first pyramid structure 1 has irregular deformation, so that the crystal structure of the first pyramid structure 1 becomes from a regular tetrahedral structure to an irregular tetrahedral structure. The irregular tetrahedral structure leads to dislocations and dangling bonds in the emitter, thereby modifying the emitter. In particular, the generated dislocations and dangling bonds lead to a deep energy level in interior of the first portion 11 of the P-type emitter 10, thereby reducing the sheet resistance of the first portion 11 of the P-type emitter 10. The first portion 11 of the P-type emitter 10 can have a relatively low sheet resistance by modifying the structure of the first portion 11 of the P-type emitter 10. In this way, the resistance of the first portion 11 of the P-type emitter 10 can be reduced without greatly increasing the doping concentration of the first portion 11 of the P-type emitter 10.

The inclined surfaces of the second pyramid structure 2 on the top surface of the second portion 12 are designed to be planes, that is, the second pyramid structure 2 is not irregularly deformed, so that the second pyramid structure 2 is a regular tetrahedron structure. Thus, dislocations and dangling bonds will not be caused in the second portion 12 of the P-type emitter 10, and thus no deep energy levels will be formed in the second portion 12 of the P-type emitter 10, thereby leading to a relatively high sheet resistance of the second portion 12 of the P-type emitter 10, and maintaining a good passivation performance of the second portion 12 of the P-type emitter 10. In this way, the open-circuit voltage and short-circuit current of the solar cell can be relatively high, and photoelectric conversion performance of the solar cell can be improved.

In some embodiments, a method for forming the P-type emitter 10 includes the following operations.

Figure 8:
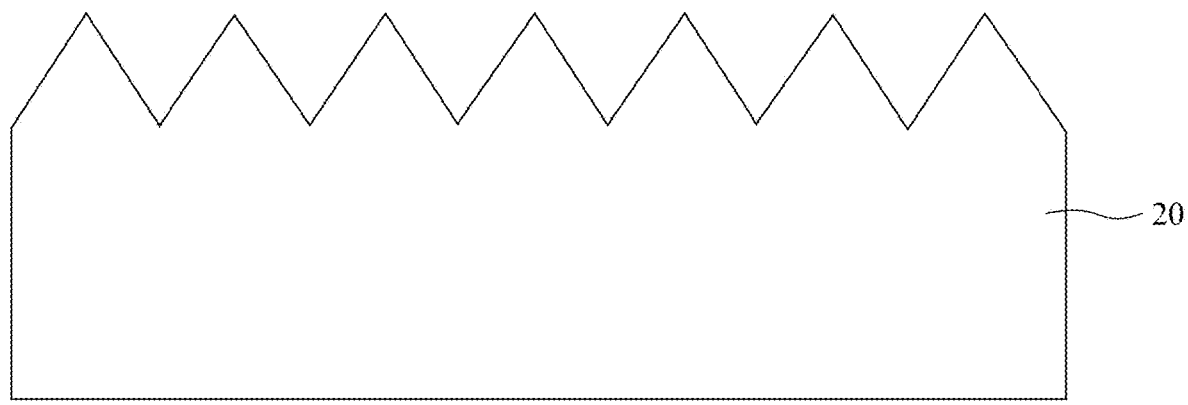
FIG. 8 is a structural schematic diagram corresponding to the operation of providing a N-type initial substrate in a production method for a solar cell according to an embodiment of the present disclosure.

Referring to FIG. 8, an N-type initial substrate 20 is provided, and the N-type initial substrate 20 is used as a basis for forming the N-type substrate 100 and the P-type emitter 10. Therefore, the materials of the N-type initial substrate 20 and the N-type substrate 100 may be of the same.

In some embodiments, a first surface of the N-type initial substrate 20 may be designed as a pyramid textured surface, so that the reflectivity of the first surface of the N-type initial substrate 20 to incident light is low, and the absorption and utilization rate of light is high. In some embodiments, the N-type initial substrate 20 is a N-type initial semiconductor substrate, that is, the N-type initial substrate 20 is doped with N-type dopant ions, and the N-type dopant ions may be any one of phosphorus ions, arsenic ions, or antimony ions.

The method for forming the P-type emitter 10 further includes, referring to FIGS. 9 and 10, depositing a trivalent doping source on a top surface of the N-type initial substrate 20, so as to subsequently diffuse the trivalent doping source into the N-type initial substrate 20 to form the P-type emitter 10. In some embodiments, the trivalent doping source may be a boron source, and may for example be boron trichloride or boron tribromide.

Figure 9:
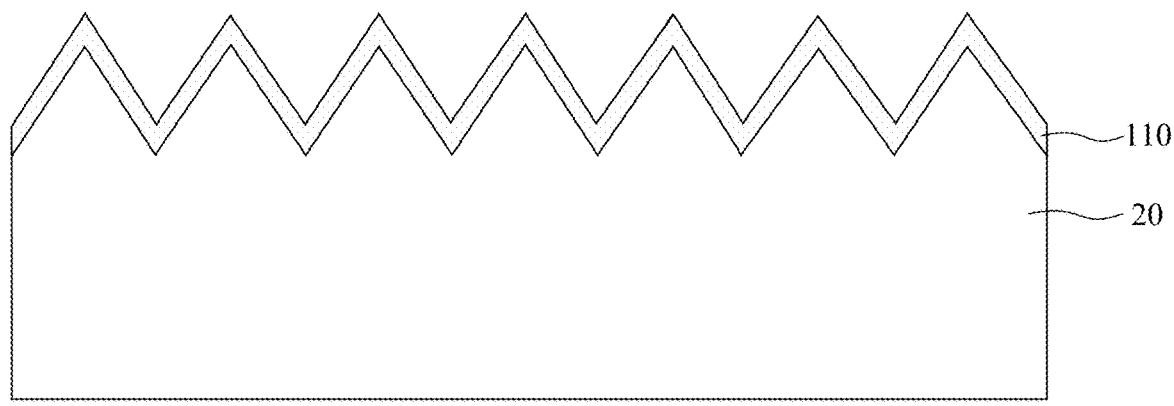
FIG. 9 is a structural schematic diagram corresponding to the operation of forming a first thin film layer in the production method according to an embodiment of the present disclosure.

Referring to FIG. 9, in some embodiments, depositing the trivalent doping source on the top surface of the N-type initial substrate 20 includes forming a first thin film layer 110, the first thin film layer 110 includes the trivalent dopant source and at least one of boron element, oxygen element, silicon element, chlorine element, nitrogen element or carbon element. A deposition time ranges from 20 s to 5000 s, and a temperature ranges from 500° C. to 1300° C. As an example, in some embodiments, when the trivalent doping source is a boron source, the main components of the first thin film layer 110 may include silicon oxide and boron oxide, and the trivalent doping source may be stored in the first thin film layer 110 in a form of boron oxide. Since silicon oxide has high hardness, it can protect the N-type initial substrate 20 during the doping process. In addition, the first thin film layer 110 further includes a small amount of chlorine element, nitrogen element and carbon element, these elements provide the first thin film layer 110 with a higher refractive index than that of the existing borosilicate glass. In this way, during the subsequent treatment performed on a preset region of first thin film layer 110 by using a process of external energy source treatment, the first thin film layer 110 can absorb more external energy sources, such as laser, so that more laser can irradiate to the interior of the first thin film layer 110. In this way, the loss of laser can be reduced, and the amount of the trivalent doping source diffused into the N-type initial substrate 20 can be increased.

In addition, since the thickness of the first thin film layer 110 is relatively small, when a relatively thin first thin film layer 110 includes relatively many trivalent doping sources, the trivalent doping sources aggregates in the first thin film layer 110, thereby increasing the concentration of the trivalent doping source. In this way, when the trivalent doping source is subsequently diffused into the N-type initial substrate 20 by the doping process, the doping process is facilitated and it is easier to form the first portion of the P-type emitter with relatively high doping concentration, thereby reducing the sheet resistance of the first portion of the P-type emitter. In addition, since the thickness of the first thin film layer 110 is relatively small, the trivalent doping source that can be included in the first thin film layer 110 will not be too much, so that excessive trivalent doping source elements can prevented from being doped into the N-type initial substrate 20. In this way, the problem that relatively many trivalent doping source elements become strong recombination centers due to too many trivalent doping source elements being contained in the N-type initial substrate 20, which leads to poor passivation capability of the formed first portion 11 of the P-type emitter 10 can be prevented.

In some embodiments, a method for forming the first thin film layer 110 may include depositing a trivalent doping source on the first surface of the N-type initial substrate 20, the trivalent doping source is a simple substance or compound containing a trivalent element. In some embodiments, when the trivalent doping source is a boron source, the simple substance or compound containing a trivalent element may be boron tribromide or boron trichloride. In some embodiments, boron trichloride can be deposited, as the trivalent doping source, on the first surface of the N-type initial substrate 20 by chemical vapor deposition or spin coating, and the concentration of the trivalent doping source can be $1E^{18}$-$9E^{22}$ atoms/cm$^3$.

In some embodiments, a method of depositing the trivalent doping source may include: performing a boat feeding process on the N-type initial substrate 20; then raising a temperature to a first preset temperature, the first preset temperature may be 500° C. to 900° C.; depositing a trivalent doping source on the first surface of the N-type initial substrate 20; then raising the temperature to a second preset temperature, the second preset temperature is greater than the first preset temperature, for example, the second preset temperature may be 900° C. to 1300° C.; and performing a junction pushing process in a nitrogen atmosphere, which can improve the density and uniformity of the formed first thin film layer 110. In some embodiments, while depositing the trivalent doping source, a small amount of oxygen may be introduced, for example, 100 sccm to 2000 sccm, which is conducive to the further formation of a first thin film layer 110 with relatively high density.

Figure 10:
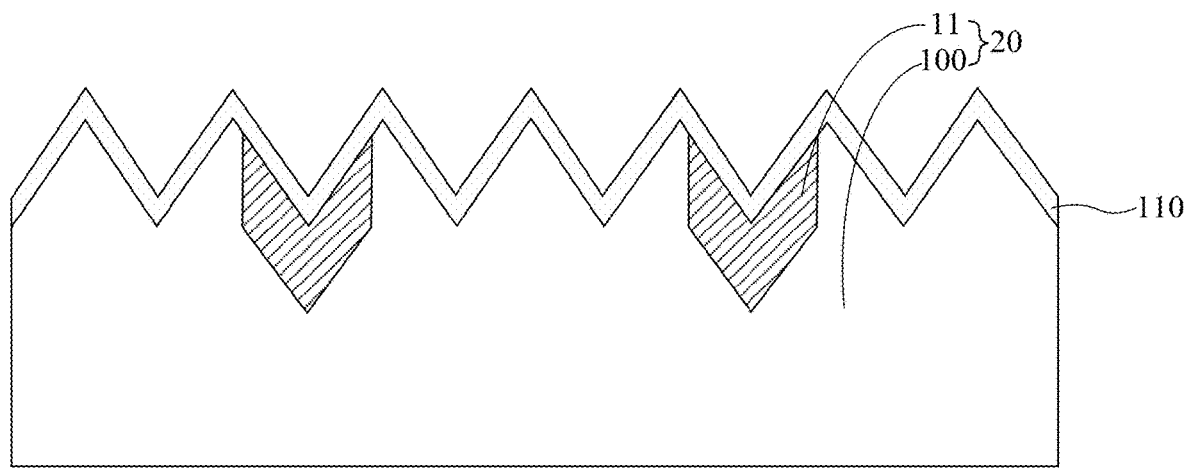
FIG. 10 is a structural schematic diagram corresponding to the operation of forming a first portion of the P-type emitter in the production method according to an embodiment of the present disclosure.

Referring to FIG. 10, after depositing the trivalent dopant source, the preset region of the top surface of the N-type initial substrate 20 is treated using the process of external energy source treatment, and the trivalent dopant source treated by the process of external energy source treatment is diffused into an interior of the N-type initial substrate 20 to form the first portion 11 of the P-type emitter 10 in the preset region of the N-type initial substrate 20, and a top surface of the first portion 11 of the P-type emitter 10 is exposed from the N-type initial substrate 20. The process of external energy source treatment is performed on the preset region, so that the trivalent doping source in the preset region of the first thin film layer 110 is diffused into the interior of the N-type initial substrate 20. At the same time, with the process of external energy source treatment, the crystal structure of the preset region of the N-type initial substrate 20 is deformed to form the first pyramid structure 1. It is noted that the structure of the N-type initial substrate 20 is a regular tetrahedral structure before performing the process of external energy source treatment. After the process of external energy source treatment, at least part of the surfaces of the first pyramid structure 1 becomes concave or convex relative to the center of the first pyramid structure 1, that is, the first pyramid structure 1 is transformed from the regular tetrahedral structure to an irregular tetrahedral structure. The first pyramid structure 1 causes dislocations and dangling bonds to appear in the preset region of the N-type initial substrate 20. After the preset region of the N-type initial substrate 20 is doped with the trivalent doping source, the top surface of the formed first portion 11 of the P-type emitter 10 has the first pyramid structure 1. In this way, the first portion 11 of the P-type emitter 10 can have a deep energy level, and the sheet resistance of the first portion 11 of the P-type emitter 10 can be reduced.

In some embodiments, the process of external energy source treatment includes any one of a laser doping process, plasma irradiation, or a directional ion implantation process. Taking the laser doping process as an example, the laser doping process is simple to operate, and is conducive to large-scale utilization, and efficiency of the laser doping is high, thus the trivalent doping source can be efficiently doped into the N-type initial substrate 20. The first thin film layer 110 can absorb a certain amount of laser energy, which can protect the N-type initial substrate 20 and reduce the damage to the N-type initial substrate 20 caused by laser doping, so that the formed first portion 11 of the P-type emitter 10 has high integrity, thereby obtaining good passivation performance of the first portion 11 of the P-type emitter 10. In addition, since the concentration of the trivalent doping source in the first thin film layer 110 is high, when performing laser doping, the trivalent doping source is more easily doped into the N-type initial substrate 20, so that the junction depth of the formed first portion 11 of the P-type emitter 10 is deep. That is to say, the deep junction depth of the formed first portion 11 of the P-type emitter 10 can be realized using little laser energy, thus the laser energy can be reduced when the junction depth of the first portion 11 of the P-type emitter 10 can be ensured to meet the expectations, thereby further reducing the damage of the laser to the N-type initial substrate 20.

Moreover, after irradiate the preset region of the N-type initial substrate 20 using the laser process, it is easier to transform the crystal structure of the first portion 11 of the P-type emitter 10 into an irregular tetrahedral structure, so that the density of the dislocations formed in the interior of the first portion 11 of the P-type emitter 10 is relatively high, which is conducive to further reduction of the sheet resistance.

In some embodiments, after forming the first portion 11 of the P-type emitter 10, the method further includes: performing a cleaning operation on the first surface of the N-type initial substrate 20 to remove the first thin film layer 110. In this way, the remaining trivalent doping sources in the first thin film layer 110 and the adsorbed impurities on the surface of the N-type initial substrate 20 can be removed, which is conducive to prevention of leakage. Furthermore, the first thin film layer 110 contains a large number of trivalent doping sources, and these trivalent doping sources will be converted into non-activated trivalent doping sources, such as non-activated boron, in the subsequent high temperature process for forming the second thin film layer. The existence of the non-activated trivalent doping sources will increase the recombination of carriers on the surface of the N-type initial substrate 20, thereby affecting the photoelectric conversion efficiency of the solar cell. Therefore, removing the first thin film layer 110 before the operation of forming the second thin film layer can also reduce the content of the non-activated trivalent doping sources on the surface of the N-type initial substrate 20 after subsequently forming the second thin film layer, thereby reducing the recombination of carriers on the surface of the N-type initial substrate 20 and improving the photoelectric conversion efficiency of the solar cell. As an example, the cleaning operation may include cleaning the surface of the N-type initial substrate 20 with alkali solution or acid solution, where the alkali solution may be at least one of KOH or H2O2aqueous solution, and the acid solution may be at least one of HF or HCl aqueous solution.

Figure 11:
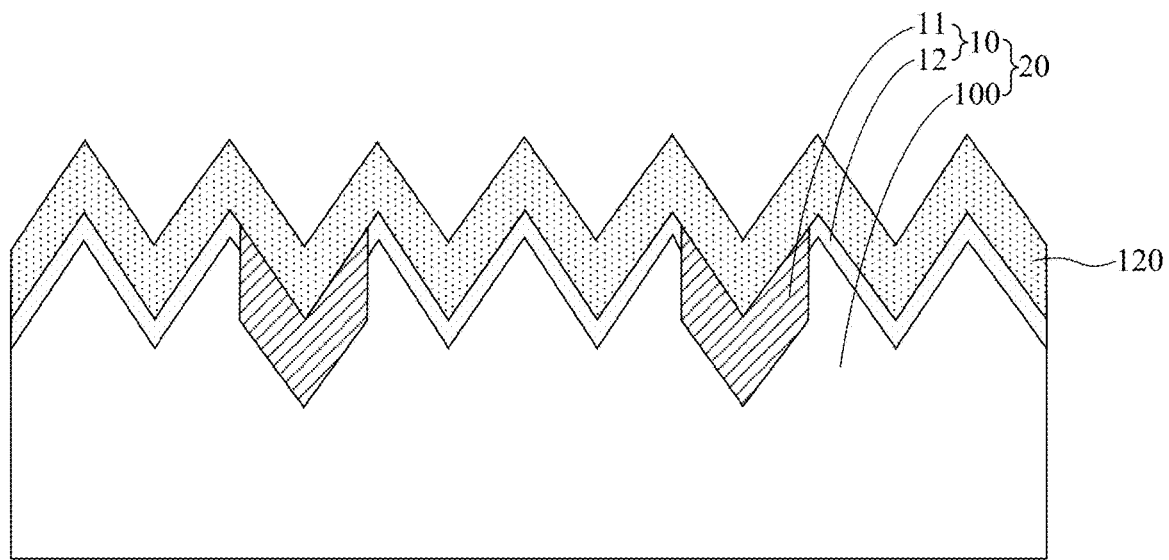
FIG. 11 is a structural schematic diagram corresponding to the operation of forming a second thin film layer in the production method according to an embodiment of the present disclosure.
Figure 12:
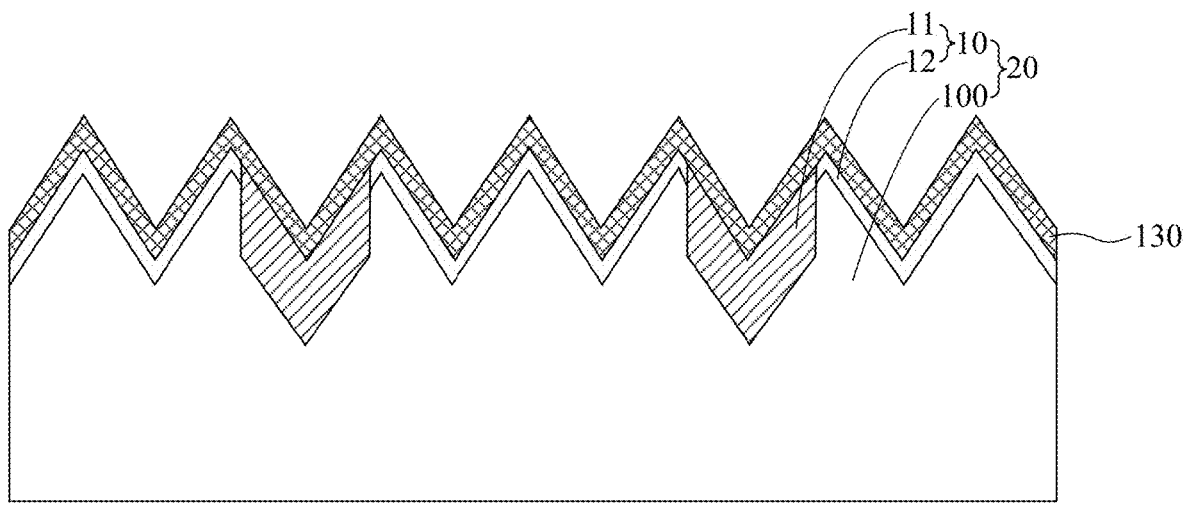
FIG. 12 is a structural schematic diagram corresponding to the operation of forming an anti-reflection layer in the production method according to an embodiment of the present disclosure.

After forming the first portion 11 of the P-type emitter 10, referring to FIGS. 11 to 12, a high temperature treatment is performed on the N-type initial substrate 20 to form the P-type emitter 10 in the N-type initial substrate 20, and the top surface of the P-type emitter 10 is exposed from the N-type initial substrate 20. As an example, the N-type substrate 100 is formed in a region of the N-type initial substrate 20 excluding the P-type emitter 10, and the second portion 12 of the P-type emitter 10 is formed in a region of the P-type emitter 10 excluding the preset region. Since the process of external energy source treatment is only performed on the surface of the preset region of the N-type initial substrate 20, the trivalent doping sources in the first thin film layer 110 corresponding to the preset region are diffused into the interior of the N-type initial substrate 20. Thus, the junction depth of the formed first portion 11 of the P-type emitter 10 is greater than the junction depth of the second portion 12 of the P-type emitter 10, and the metal electrode can be arranged to be in electrical connection with the first portion 11 of the P-type emitter 10. In this way, the problem that the paste for forming the metal electrode penetrates the P-type emitter 10 and directly contacts with the N-type initial substrate 20 during the sintering process can be prevented. Moreover, the junction depth of the second portion 12 is designed to be shallow, that is, the thickness of the second portion 12 of the P-type emitter 10 is small, so that the number of doping elements of the second portion 12 is less than the number of doping elements of the first portion 11, that is, the doping concentration of the second portion 12 of the P-type emitter 10 is lower. Therefore, compared with the first portion 11 of the P-type emitter 10, the second portion 12 of the P-type emitter 10 has a better passivation effect, which is conducive to reduction of the recombination of carriers and to improvement of the open-circuit voltage and short-circuit current of the solar cell.

After performing the high temperature treatment on the N-type initial substrate 20, part of the trivalent doping sources is doped into the N-type initial substrate 20, so that part of the N-type initial substrate 20 is transformed into the second portion 12 of the P-type emitter 10. That is to say, the portion of the N-type initial substrate 20 excluding the first portion 11 of the P-type emitter 10 and the second portion 12 of the P-type emitter 10 corresponds to the N-type substrate 100.

Referring to FIG. 11, in some embodiments, in the operation of performing the high temperature treatment on the N-type initial substrate 20, oxygen of a first flow rate is introduced for a duration ranged from 500 s to 10000 s and under a temperature ranged from 500° C. to 1500° C., to form a second thin film layer 120, a thickness of the second thin film layer 120 is smaller than a thickness of the first thin film layer 110. The amount of the oxygen introduced in the process of forming the second thin film layer 120 is relatively large, so that the oxygen can react with more trivalent doping sources, thus the thickness of the formed second thin film layer 120 is larger than the thickness of the first thin film layer 110. In this way, on one hand, when the thinner first thin film layer 110 includes more trivalent doping sources, the trivalent doping sources aggregate in the first thin film layer 110, thereby increasing the concentration of the trivalent doping sources, which is conducive to the laser doping, and because the first thin film layer 110 is relatively thin, it is easy for the laser to penetrate into the N-type initial substrate 20. On the other hand, the second thin film layer 120 is thicker, which can ensure that the amount of trivalent doping sources absorbed by the second thin film layer 120 in a region excluding the preset region of the first surface of the N-type initial substrate 20 is relatively large. In this way, the doping concentration at the top surface of the first portion 11 of the P-type emitter 10 and the doping concentration at the top surface of the second portion 12 of the P-type emitter 10 can be reduced, and the passivation performance can be improved.

In some embodiments, the first flow rate ranges from 200 sccm to 80,000 sccm. For example, the first flow rate may be 200 sccm to 1000 sccm, 1000 sccm to 5000 sccm, 5000 sccm to 10000 sccm, 10000 sccm to 20000 sccm, 20000 sccm to 30000 sccm, 30000 sccm to 50000 sccm, 50000 sccm to 70000 sccm, or 70000 sccm to 80000 sccm. Setting the first flow rate within this range can ensure a high first flow rate, so that the formed second thin film layer 120 is thicker, and the second thin film layer 120 can absorb more trivalent doping sources. In this way, the doping concentration at the top surface of the second portion 12 of the P-type emitter 10 can be relatively low, which is conducive to obtaining a high sheet resistance of the second portion 12 of the P-type emitter 10, thus the passivation performance of the second portion 12 of the P-type emitter 10 can be improved.

Referring to FIG. 12, in some embodiments, the method further includes: performing the cleaning operation on the N-type initial substrate 20 to remove the second thin film layer 120; forming an anti-reflection layer 130 on the first surface of the N-type initial substrate 20, the anti-reflection layer 130 is located on the top surface of the P-type emitter 10, in some embodiments, the anti-reflection layer 130 may be a silicon nitride layer including silicon nitride material. In some embodiments, the anti-reflection layer 130 may be formed by a plasma enhanced chemical vapor deposition method (PECVD).

Figure 13:
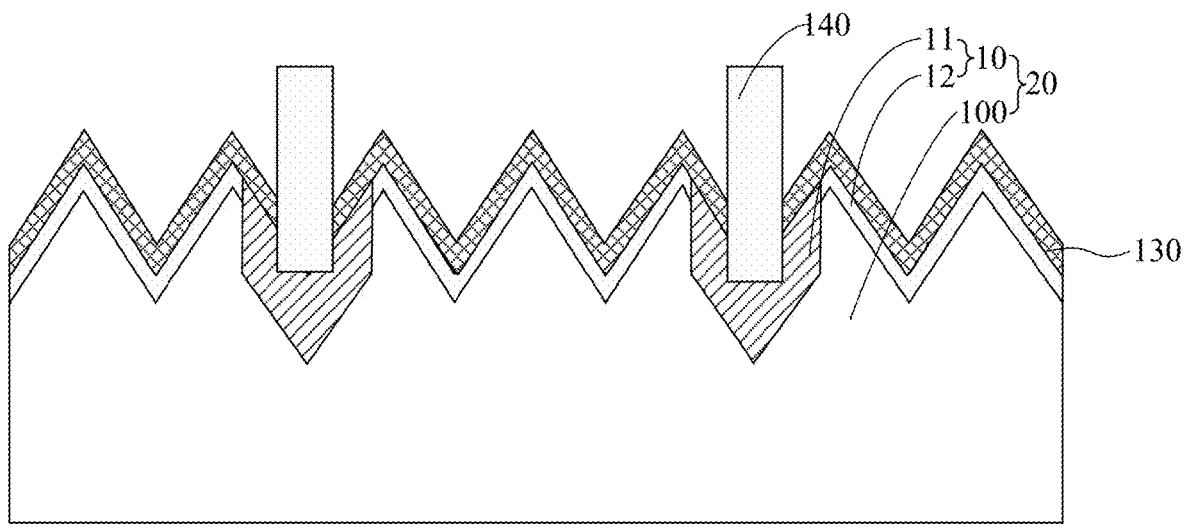
FIG. 13 is a structural schematic diagram corresponding to the operation of forming a first metal electrode in the production method according to an embodiment of the present disclosure.

Referring to FIG. 13, in some embodiments, the method further includes: forming a first metal electrode 140, and the first metal electrode 140 is electrically connected to the first portion 11 of the P-type emitter 10. The first metal electrode 140 is located on the first surface of the N-type initial substrate 20. Since the sheet resistance of the first portion 11 of the P-type emitter 10 is low, the first metal electrode 140 is arranged to be electrically connected to the first portion 11 of the P-type emitter 10. In this way, the contact resistance between the first metal electrode 140 and the first portion 11 of the P-type emitter 10 can be reduced, thereby facilitating the transport of carriers in the first metal electrode 140 penetrating the anti-reflection layer. The specific principles are as follows.

The incident light reaches the N-type initial substrate 20 through the first portion 11 of the P-type emitter 10 and the second portion 12 of the P-type emitter 10, and generates a plurality of electron-hole pairs in the N-type initial substrate 20. The plurality of electron-hole pairs in the N-type initial substrate 20 are separated into electrons and holes, respectively, under the action of the photoelectric effect, the separated electrons transport to the N-type initial substrate 20, and the separated holes transport to the first portion 11 of the P-type emitter 10 and the second portion 12 of the P-type emitter 10. The electrons transporting to the first portion 11 of the P-type emitter 10 and the second portion 12 of the P-type emitter 10 are collected by the first metal electrode 140 in contact with the first portion 11 of the P-type emitter 10, and transport in the first metal electrode 140 penetrating the anti-reflection layer. That is to say, the electrons in the first portion 11 and the second portion 12 are desired to transport to the first metal electrode 140 in contact with the first portion 11 of the P-type emitter 10. Therefore, the transport of carrier can be greatly improved by the improvement of the contact resistance between the first metal electrode 140 and the first portion 11 of the P-type emitter 10.

In some embodiments, a method for forming the first metal electrode 140 includes: printing conductive paste on a top surface of the anti-reflection layer 130 in the preset region, the conductive material in the conductive paste may be at least one of silver, aluminum, copper, tin, gold, lead or nickel; and sintering the conductive paste, for example, the sintering may be performed under a peak temperature of 750° C. to 850° C., so as to penetrate the anti-reflection layer to form the first metal electrode 140.

In some embodiments, a width of the first metal electrode 140 is less than or equal to the width of the first portion 11 of the P-type emitter 10, so that the first metal electrode 140 can be surrounded by the first portion 11 of the P-type emitter 10, and the side surfaces and the bottom surface of the first metal electrode 140 are in contact with the first portion 11 of the P-type emitter 10. Compared with the case that a part of the side surfaces of the first metal electrode 140 is in contact with the second portion 12 of the P-type emitter 10 having higher sheet resistance, since the sheet resistance of the first portion 11 of the P-type emitter 10 is lower, the contact resistance between the first metal electrode 140 and the first portion 11 of the P-type emitter 10 is lower, which is conducive to the further improvement of the transport of carriers in the first portion 11 of the P-type emitter 10 and the second portion 12 of the P-type emitter 10.

Figure 14:
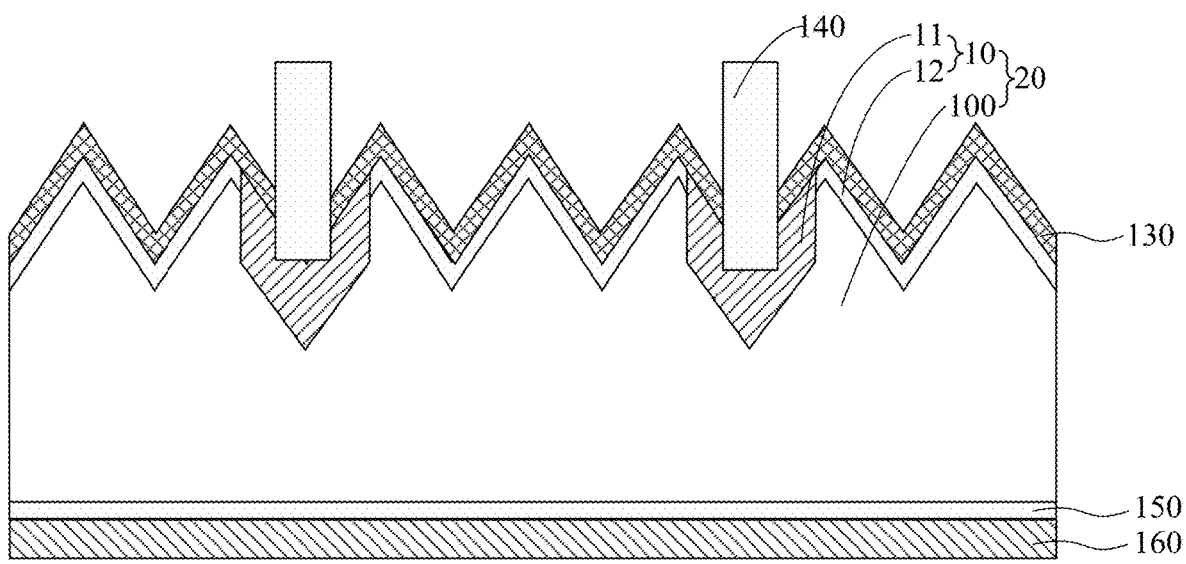
FIG. 14 is a structural schematic diagram corresponding to the operation of forming a tunnel layer and a doped conductive layer in the production method according to an embodiment of the present disclosure.

Referring to FIG. 14, a tunnel layer 150 and a doped conductive layer 160 are formed sequentially over a second surface of the N-type substrate 100 in a direction away from the N-type substrate 100.

The tunnel layer 150 is used to realize the interface passivation of the second surface of the N-type substrate 100. In some embodiments, the tunnel layer 150 may be formed using a deposition process, such as a chemical vapor deposition process. In some other embodiments, the tunnel layer 150 may be formed using an in-situ generation process. As an example, in some embodiments, the material of the tunnel layer 150 may be a dielectric material, such as silicon oxide.

The doped conductive layer 160 is used to form field passivation. In some embodiments, the material of the doped conductive layer 160 may be doped silicon. In some embodiments, the doped conductive layer 160 and the N-type substrate 100 include doping elements of the same conductivity type, the doped silicon may include one or more of N-type doped polysilicon, N-type doped microcrystalline silicon and N-type doped amorphous silicon. In some embodiments, the doped conductive layer 160 may be formed using a deposition process. As an example, intrinsic polysilicon may be deposited on the surface of the tunnel layer 150 away from the N-type substrate 100 to form a polysilicon layer, and phosphorus ions may be doped in manners of ion implantation and source diffusion to form an N-type doped polysilicon layer. The N-type doped polysilicon layer serves as the doped conductive layer 160.

Referring to FIG. 1, in some embodiments, the method further includes forming a first passivation layer 170 on a surface of the doped conductive layer 160 away from the N-type substrate 100. In some embodiments, the material of the first passivation layer 170 may be one or more of silicon oxide, aluminum oxide, silicon nitride, silicon oxynitride and silicon oxycarbonitride. In some embodiments, the first passivation layer 170 may be a single-layer structure. In some other embodiments, the first passivation layer 170 may be a multi-layer structure. As an example, in some embodiments, the first passivation layer 170 may be formed using a PECVD method.

In some embodiments, the method further includes forming a second metal electrode 180 penetrating the first passivation layer 170 to form an electrical connection with the doped conductive layer 160. As an example, the method for forming the second metal electrode 180 may be the same as the method for forming the first metal electrode 140, and the material of the first metal electrode 140 may be the same as the material of the second metal electrode 180.

In the production method for a solar cell as provided in the above embodiments, at least one inclined surface of the formed first pyramid structure 1 has irregular deformation, so that the crystal structure of the first pyramid structure 1 becomes from a regular tetrahedral structure to an irregular tetrahedral structure. The irregular tetrahedral structure leads to dislocations and dangling bonds in the emitter, thereby modifying the emitter. In particular, the generated dislocations and dangling bonds lead to a deep energy level in interior of the first portion 11 of the P-type emitter 10, thereby reducing the sheet resistance of the first portion 11 of the P-type emitter 10. The first portion 11 of the P-type emitter 10 can have a relatively low sheet resistance by modifying the structure of the first portion 11 of the P-type emitter 10. In this way, the sheet resistance of the first portion 11 of the P-type emitter 10 can be reduced without greatly increasing the doping concentration of the first portion 11 of the P-type emitter 10, which not only can improve the ohmic contact, but also is conducive to maintenance of a good passivation effect of the first portion 11 of the P-type emitter 10, thus the overall photoelectric conversion performance of the formed solar cell can be improved.

Although the present disclosure is disclosed above with exemplary embodiments, they are not used to limit the claims. Any person skilled in the art can make some possible changes and modifications without departing from the concept of the present disclosure. The scope of protection of the present disclosure shall be subject to the scope defined by the claims.

Those having ordinary skill in the art shall understand that the above embodiments are exemplary implementations for realizing the present disclosure. In practice, any person skilled in the art to which the embodiments of the present disclosure belong may make any modifications and changes in forms and details without departing from the scope of the present disclosure. Therefore, the patent protection scope of the present disclosure shall still be subject to the scope limited by the appended claims.

What is claimed is:

1. A solar cell, comprising:
a N-type substrate, wherein the N-type substrate has a first surface and the first surface is a textured surface having a plurality of pyramidal protrusions;
a P-type emitter formed on the first surface, wherein the P-type emitter comprises a first portion and a second portion, a top surface of the first portion comprises first pyramid structures formed on a first set of pyramidal protrusions of the plurality of pyramidal protrusions, one respective first pyramid structure of the first pyramid structures is an irregular tetrahedral structure, and at least a part of at least one inclined surface of the respective first pyramid structure is concave or convex relative to a center of the respective first pyramid structure, wherein a top surface of the second portion comprises second pyramid structures formed on a second set of pyramidal protrusions of the plurality of pyramidal protrusions, one respective second pyramid structure of the second pyramid structures is a regular tetrahedron structure, and inclined surfaces of the respective second pyramid structure are planar, and wherein in a direction perpendicular to the first surface of the N-type substrate, a junction depth of the first portion is greater than a junction depth of the second portion; and
a tunnel layer and a doped conductive layer sequentially formed over a second surface of the N-type substrate in a direction away from the N-type substrate;
wherein a crystal structure of the first portion of the P-type emitter has dislocations; and
wherein at least one first pyramid structure of the first pyramid structures comprises a substructure shaped as a sphere or a spheroid at a top of the at least one first pyramid structure.

2. The solar cell according to claim 1, wherein a sheet resistance of the first portion of the P-type emitter is smaller than a sheet resistance of the second portion of the P-type emitter.

3. The solar cell according to claim 2, wherein the sheet resistance of the first portion of the P-type emitter ranges from 20 ohm/sq to 300 ohm/sq, and the sheet resistance of the second portion of the P-type emitter ranges from 100 ohm/sq to 1000 ohm/sq.

4. The solar cell according to claim 1, wherein a height of the first pyramid structure ranges from 0.1 μm to 5 μm, and an one-dimensional size of a bottom of the first pyramid structure ranges from 0.1 μm to 5 μm.

5. The solar cell according to claim 1, wherein a ratio of the junction depth of the first portion to the junction depth of the second portion is not less than 2.

6. The solar cell according to claim 5, wherein the junction depth of the first portion ranges from 2um to 10um, and the junction depth of the second portion ranges from 0.1 μm to 3 μm.

7. The solar cell according to claim 5, wherein a doping concentration at the top surface of the first portion of the P-type emitter is greater than or equal to a doping concentration at the top surface of the second portion of the P-type emitter.

8. The solar cell according to claim 7, wherein the doping concentration at the top surface of the first portion of the P-type emitter ranges from 1E18 atoms/cm$^3$ to 5E20 atoms/cm$^3$.

9. The solar cell according to claim 8, wherein a difference between the doping concentration at the top surface of the first portion and a doping concentration at a bottom surface of the first portion ranges from 1E16 atoms/cm$^3$ to 5E20 atoms/cm$^3$.

10. The solar cell according to claim 8, wherein a difference between the doping concentration at the top surface of the second portion and a doping concentration at a bottom surface of the second portion ranges from 1E16 atoms/cm$^3$ to 1E20 atoms/cm$^3$.

11. The solar cell according to claim 1, wherein a ratio of a width of the second portion to a width of the first portion is not less than 60.

12. The solar cell according to claim 1, further comprising a first metal electrode, wherein the first metal electrode is formed on the first surface of the N-type substrate, and is electrically connected to the first portion of the P-type emitter.

13. The solar cell according to claim 1, wherein the P-type emitter further comprises a transition region located between the first portion and the second portion, wherein a doping concentration at a top surface of the transition region is greater than or equal to the doping concentration at the top surface of the second portion, and is less than or equal to the doping concentration at the top surface of the first portion.

14. A photovoltaic module, comprising:
a cell string including a plurality of solar cells, wherein the plurality of solar cells are electrically connected in sequence;
an encapsulation layer configured to cover a surface of the cell string; and
a cover plate configured to cover a surface of the encapsulation layer facing away from the cell string;
wherein each of the plurality of solar cells comprise:
a N-type substrate, wherein the N-type substrate has a first surface and the first surface is a textured surface having a plurality of pyramidal protrusions;
a P-type emitter formed on the first surface, wherein the P-type emitter comprises a first portion and a second portion, a top surface of the first portion comprises first pyramid structures formed on a first set of pyramidal protrusions of the plurality of pyramidal protrusions, one respective first pyramid structure of the first pyramid structures is an irregular tetrahedral structure, and at least a part of at least one inclined surface of the respective first pyramid structure is concave or convex relative to a center of the respective first pyramid structure, wherein a top surface of the second portion comprises second pyramid structures formed on a second set of pyramidal protrusions of the plurality of pyramidal protrusions, one respective second pyramid structure of the second pyramid structures is a regular tetrahedron structure, and inclined surfaces of the respective second pyramid structure are planar, and wherein in a direction perpendicular to the first surface of the N-type substrate, a junction depth of the first portion is greater than a junction depth of the second portion; and
a tunnel layer and a doped conductive layer sequentially formed over a second surface of the N-type substrate in a direction away from the N-type substrate;
wherein a crystal structure of the first portion of the P-type emitter has dislocations; and
wherein at least one first pyramid structure of the first pyramid structures comprises a substructure shaped as a sphere or a spheroid at a top of the at least one first pyramid structure.

15. The photovoltaic module according to claim 14, wherein a sheet resistance of the first portion of the P-type emitter is smaller than a sheet resistance of the second portion of the P-type emitter.

16. The photovoltaic module according to claim 14, wherein a ratio of the junction depth of the first portion to the junction depth of the second portion is not less than 2.

* * * * *